(12) United States Patent
Matsumura et al.

(10) Patent No.: US 8,183,144 B2
(45) Date of Patent: May 22, 2012

(54) METHOD OF MANUFACTURING SEMICONDUCTOR DEVICE

(75) Inventors: Tamio Matsumura, Tokyo (JP); Tadashi Tsujino, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 370 days.

(21) Appl. No.: 11/561,038

(22) Filed: Nov. 17, 2006

(65) Prior Publication Data

US 2007/0173045 A1    Jul. 26, 2007

(30) Foreign Application Priority Data

Jan. 23, 2006  (JP) .................. 2006-013349

(51) Int. Cl.
    *H01L 21/44*    (2006.01)
(52) U.S. Cl. ........................ 438/614; 257/765
(58) Field of Classification Search .......... 438/643, 438/763, 614, 615, 617; 257/99, 750, 763, 257/765
    See application file for complete search history.

(56) References Cited

U.S. PATENT DOCUMENTS

| | | | |
|---|---|---|---|
| 5,342,793 A * | 8/1994 | Santangelo et al. .......... 438/530 |
| 5,360,765 A | 11/1994 | Kondo et al. |
| 5,731,635 A * | 3/1998 | Bareither et al. ............. 257/763 |
| 6,140,703 A * | 10/2000 | Cronin et al. ................. 257/766 |
| 6,147,403 A | 11/2000 | Matschitsch et al. |
| 6,309,965 B1 | 10/2001 | Matschitsch et al. |
| 2004/0188242 A1 * | 9/2004 | Chen ......................... 204/192.15 |
| 2005/0106859 A1 * | 5/2005 | Kim et al. ..................... 438/655 |
| 2005/0268963 A1 * | 12/2005 | Jordan et al. ................. 136/256 |

FOREIGN PATENT DOCUMENTS

| | | |
|---|---|---|
| CN | 1466172 A | 1/2004 |
| DE | 38 23 347 A1 | 1/1990 |
| DE | 277 602 A3 | 4/1990 |
| DE | 197 34 434 C1 | 12/1998 |
| EP | 0 121 605 A2 | 10/1984 |
| GB | 1149606 | 4/1969 |
| JP | 54-16979 | 2/1979 |
| JP | 1980111140 * | 8/1980 |
| JP | 1983106825 * | 6/1983 |
| JP | 4-72764 | 3/1992 |
| JP | 1992072764 * | 3/1992 |
| JP | 5-21372 | 1/1993 |
| JP | 6-37301 | 2/1994 |
| JP | 2002-25938 | 1/2002 |
| JP | 2005-33130 | 2/2005 |

OTHER PUBLICATIONS

Ng, Kwok K. Complete Guide to Semiconductor Devices. New York: Wiley, 2002, pp. 379-383.*
Office Action issued on Dec. 20, 2011, in Japanese Patent Application No. 2006-013349 filed Jan. 23, 2006.

* cited by examiner

*Primary Examiner* — Kiesha Bryant
*Assistant Examiner* — Mark Tornow
(74) *Attorney, Agent, or Firm* — Oblon, Spivak, McClelland, Maier & Neustadt, L.L.P.

(57) ABSTRACT

A method of manufacturing a semiconductor device having a back surface electrode, including: a step of preparing a semiconductor wafer having a front surface and a back surface; a thermal processing step of forming a first metal layer on the back surface of the semiconductor wafer and executing thermal processing, thereby creating an ohmic contact between the semiconductor wafer and the first metal layer; and a step of forming a second metal layer of Ni on the back surface of the semiconductor substrate after the thermal processing step.

12 Claims, 5 Drawing Sheets

METHOD OF MANUFACTURING SEMICONDUCTOR DEVICE

CROSS-REFERENCE TO RELATED APPLICATION

The disclosure of Japanese Patent Application No. 2006-13349 filed on Jan. 23, 2006 including specification, drawings and claims is incorporated herein by reference in its entirely.

BACKGROUND OF THE INVENTION

1. Field of the Invention

The present invention is related to a method of manufacturing a semiconductor device, and more particularly, to a method of manufacturing a power semiconductor device such as an insulating gate bipolar transistor.

2. Description of the Related Art

FIG. 4 and FIGS. 5A through 5D show steps for manufacturing a conventional semiconductor device, at which the back surface of a semiconductor wafer is polished and back surface metal is disposed. FIG. 4 is a top view of a semiconductor wafer 1, while FIGS. 5A through 5D are cross sectional views of FIG. 4 taken along the IV-IV direction. The conventional manufacturing steps shown in FIGS. 5A through 5D include the following steps 1 through 4.

Step 1: As shown in FIGS. 4 and 5A, a semiconductor element 2 is formed on the semiconductor wafer 1 of silicon or the like. The film thickness of the semiconductor wafer 1 is t1 (before polishing).

Step 2: As shown in FIG. 5B, for reduction of the resistance of the semiconductor element 2, the semiconductor wafer 1 is polished at its back surface into the film thickness of t2 (after polishing).

Step 3: As shown in FIG. 5C, a first metal layer 3 of Al or Al—Si alloy for instance is formed on the back surface of the semiconductor wafer 1. Following this, a barrier metal layer 4 of Ti, Mo or V for instance, a second metal layer 5 of Ni for instance, and a third metal layer 6 of Au, Ag or Au—Ag alloy for instance are formed one after another by vapor deposition, sputtering, etc.

Step 4: The semiconductor wafer 1 now seating on its back surface the four layers of the metal films is loaded into a furnace which is kept at the temperature of approximately from 300 to 470° C. and sintered. This causes the semiconductor wafer 1 and the first metal layer 3 to diffuse into each other, which creates an excellent ohmic contact (JPA 04-072764).

SUMMARY OF THE INVENTION

However, there is a problem as shown in FIG. 5D that the semiconductor wafer 1 bends as if it were pulled at its back surface after sintered.

FIG. 6 shows a relationship between the thickness and the amount of bending of a silicon wafer of six inches whose back surface seats 200 nm of the first metal layer (Al) 3, 100 nm of the barrier metal layer (Ti) 4, 500 nm of the second metal layer (Ni) 5 and 200 nm of the third metal layer (Au) 6. In FIG. 6, the mark ● represents the relationship before sintering and the mark □ represents the relationship after sintering.

For example, when the thickness of the silicon wafer is 200 μm, the amount of bending X after sintering is 1.7 mm, when the thickness is 130 μm, the amount of bending X is 3.8 mm, and when the thickness is 60 μm, the amount of bending X is 16 mm.

Bent in this fashion, the semiconductor wafer 1 get caught inside an apparatus while being transported, thereby causing a transportation error, interrupted processing, etc. In addition, soldering will become insufficient during die bonding the semiconductor wafer 1 which is cut into a chip to a substrate or the like, thereby causing defective bonding.

Through intensive research, the inventors found that the nature of the film constituting the second metal layer 5 of Ni would alter while thermally treated and influence bending of the semiconductor wafer 1, and made this invention.

Accordingly, an object of the present invention is to provide a method of manufacturing a semiconductor device which reduces the amount of bending of a semiconductor device which is attributable to thermal processing.

The present invention is directed to a method of manufacturing a semiconductor device having a back surface electrode, including: a step of preparing a semiconductor wafer having a front surface and a back surface; a thermal processing step of forming a first metal layer on the back surface of the semiconductor wafer and executing thermal processing, thereby creating an ohmic contact between the semiconductor wafer and the first metal layer; and a step of forming a second metal layer of Ni on the back surface of the semiconductor substrate after the thermal processing step.

As described above, use of the semiconductor device manufacturing method according to the present invention makes it possible to reduce the amount of bending of a semiconductor wafer and prevent a transportation error and the like related to the semiconductor wafer.

DETAILED DESCRIPTION OF THE PREFERRED EMBODIMENTS

Embodiment 1

Figure 4:
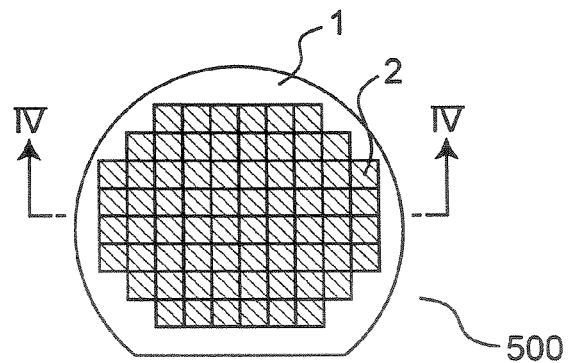
FIG. 4 is a top view of a conventional semiconductor device.

FIGS. 1A through 1E show cross sectional views of steps of manufacturing a semiconductor device according to the embodiment 1, generally denoted at 100. The cross sectional views in FIGS. 1A through 1E show the semiconductor device 100 as it is viewed from the same direction as the IV-IV direction which is shown in FIG. 4. This manufacturing method includes the following steps 1 through 5.

Figure 1A:
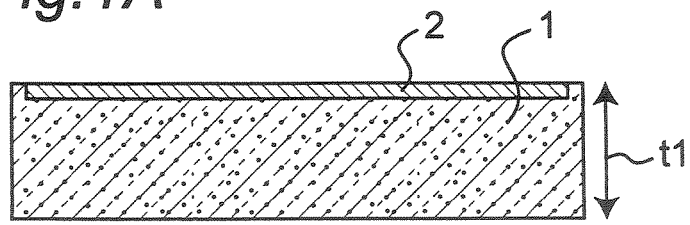
FIGS. 1A through 1E show cross sectional views of steps of manufacturing a semiconductor device according to an embodiment 1 of the present invention.

Step 1: As shown in FIG. 1A, a semiconductor element 2 such as an insulating gate bipolar transistor (IGBT) is formed on a semiconductor wafer 1 of silicon or the like. The film thickness of the semiconductor wafer 1 is t1 (before polishing).

Figure 1B:
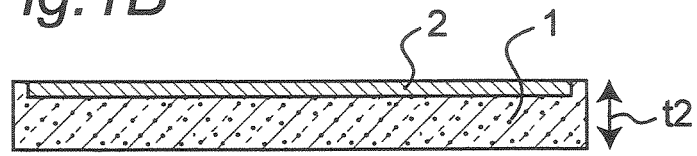

Step 2: As shown in FIG. 1B, for reduction of the resistance of the semiconductor element 2, the semiconductor wafer 1 is polished at its back surface into the film thickness of t2 (after polishing).

Figure 1C:
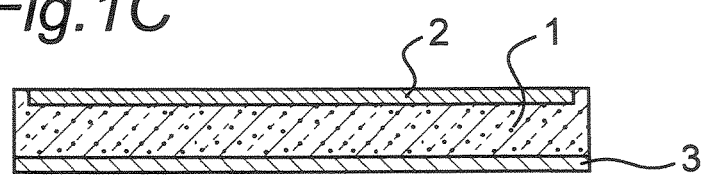

Step 3: As shown in FIG. 1C, a first metal layer 3 of Al or Al—Si alloy for instance is formed on the back surface of the semiconductor wafer 1. The first metal layer 3 is formed by vapor deposition, sputtering, etc.

Prior to the step of forming the first metal layer 3 on the back surface of the semiconductor wafer 1, B, As or other ions may be implanted from the back surface of the semiconductor wafer 1 and thus implanted ions may be activated by heating.

Figure 1D:
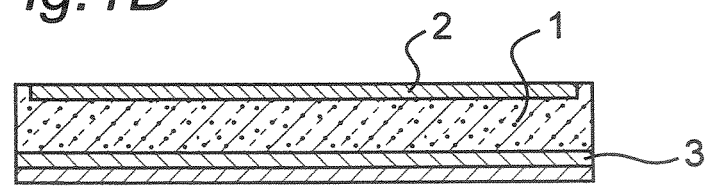

Step 4: The semiconductor wafer 1 is loaded into a furnace which is kept at the temperature of approximately from 300 to 470° C. and thermally processed (sintering). This causes the semiconductor wafer 1 and the first metal layer 3 to diffuse into each other, which creates an excellent ohmic contact. As shown in FIG. 1D, the semiconductor wafer 1 scarcely bends during this thermal processing.

Figure 1E:
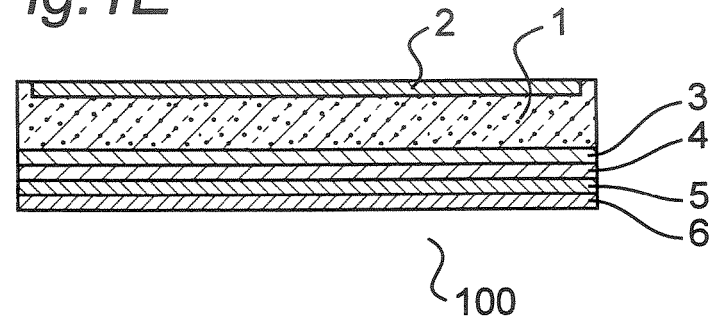

Step 5: As shown in FIG. 1E, a barrier metal layer 4 of Ti, Mo or V for instance, a second metal layer 5 of Ni for instance, and a third metal layer 6 of Au, Ag or Au—Ag alloy for instance are formed one after another by vapor deposition, sputtering, etc. No thermal processing is executed after forming these metal layers.

The second metal layer 5 is intended for favorable soldering during die bonding. The third metal layer 6 is intended for prevention of oxidization of the second metal layer 5.

In the event that a silicon wafer whose diameter is six inches and film thickness t2 is 60 μm is used as the semiconductor wafer 1, the amount of bending X after forming the first metal layer 3 of 200 nm in thickness and performing thermal processing is 1 mm or less.

After forming the barrier metal layer 4 of 100 nm in thickness, the second metal layer 5 of 500 nm in thickness and the third metal layer 6 of 200 nm in thickness, the amount of bending X is 2 mm or less.

As the thermal processing step (sintering) is not executed after forming the second metal layer 5 of Ni for instance, it is possible to reduce bending of the semiconductor wafer 1. In short, the second metal layer 5 is not subjected to thermal processing at a high temperature such as 300° C. or more, which reduces bending of the semiconductor wafer 1.

Where the manufacturing method according to the embodiment 1 is used therefore, it is possible to create an excellent ohmic contact by thermal processing and reduce bending of the semiconductor wafer.

In the step 5, the substrate temperature of the semiconductor wafer 1 during the formation of the second metal layer 5 and the third metal layer 6 is preferably 80° C. or lower. When the second metal layer 5 and the third metal layer 6 are formed at a low temperature of 80° C. or less, it is possible to further reduce the amount of bending X of the semiconductor wafer 1 down to 1 mm or less.

Embodiment 2

FIGS. 2A through 2E show cross sectional views of steps of manufacturing a semiconductor device according to the embodiment 2, generally denoted at 200. The cross sectional views in FIGS. 2A through 2E show the semiconductor device 200 as it is viewed from the same direction as the IV-IV direction which is shown in FIG. 4. In FIGS. 2A through 2E, the same reference symbols as those used in FIGS. 1A through 1E are the same or corresponding portions. This manufacturing method includes the following steps 1 through 5.

Figure 2A:
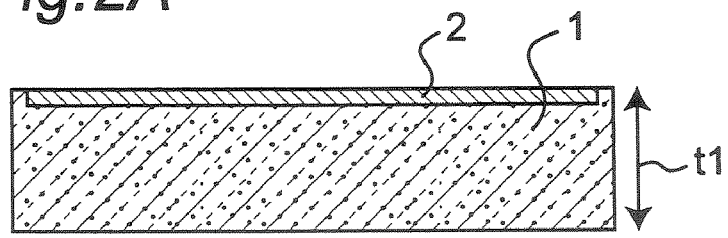
FIGS. 2A through 2E show cross sectional views of steps of manufacturing a semiconductor device according to an embodiment 2 of the present invention.
Figure 2B:
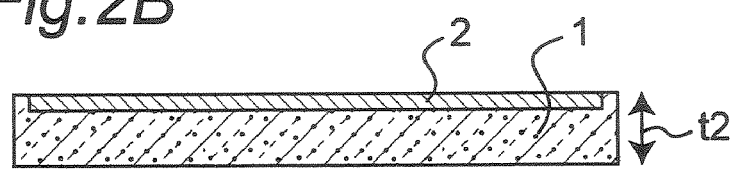

Steps 1 and 2: The steps 1 and 2 shown in FIGS. 2A and 2B are similar to the steps 1 and 2 according to the earlier embodiment 1.

Figure 2C:
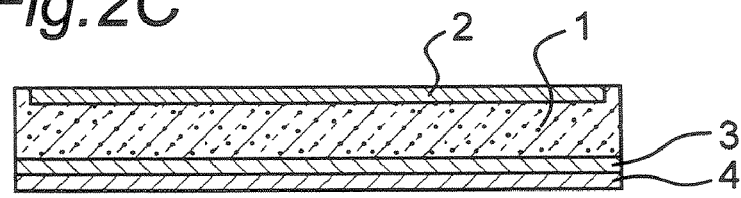

Step 3: As shown in FIG. 2C, the first metal layer 3 of Al or Al—Si alloy for instance and the barrier metal layer 4 of Ti, Mo or V for instance are formed on the back surface of the semiconductor wafer 1. The first metal layer 3 and the barrier metal layer 4 are formed vapor deposition, sputtering, etc.

Prior to the step of forming the first metal layer 3 on the back surface of the semiconductor wafer 1, B, As or other ions may be implanted from the back surface of the semiconductor wafer 1 and thus implanted ions may be activated by heating.

Figure 2D:
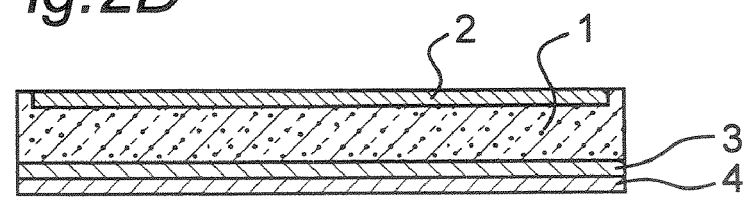

Step 4: The semiconductor wafer 1 is loaded into a furnace which is kept at the temperature of approximately from 300 to 470° C. and thermally processed (sintering). This causes the semiconductor wafer 1 and the first metal layer 3 to diffuse into each other, which creates an excellent ohmic contact. As shown in FIG. 2D, the semiconductor wafer 1 scarcely bends during this thermal processing.

Figure 2E:
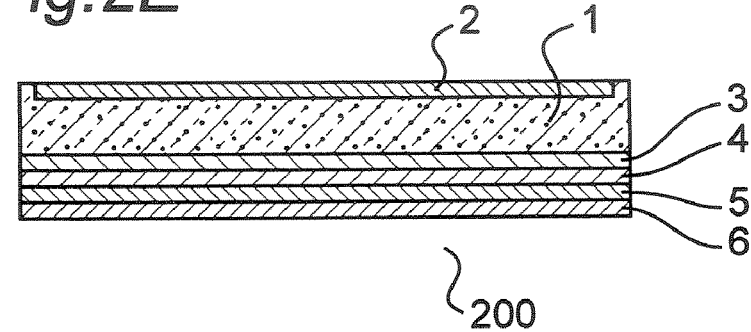
Figure 3A:
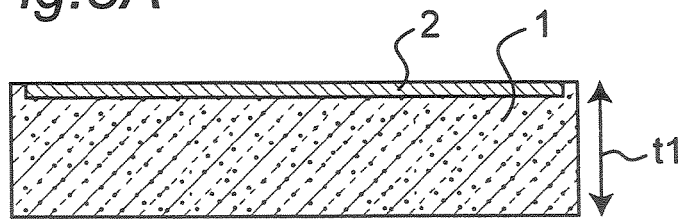
FIGS. 3A through 3E show cross sectional views of steps of manufacturing a semiconductor device according to an embodiment 3 of the present invention.
Figure 3B:
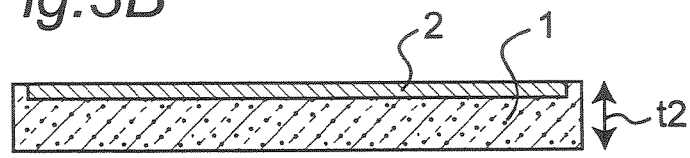
Figure 3C:
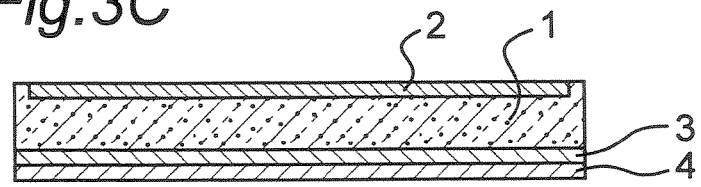
Figure 3D:
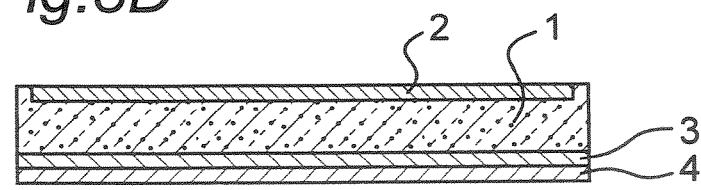
Figure 3E:
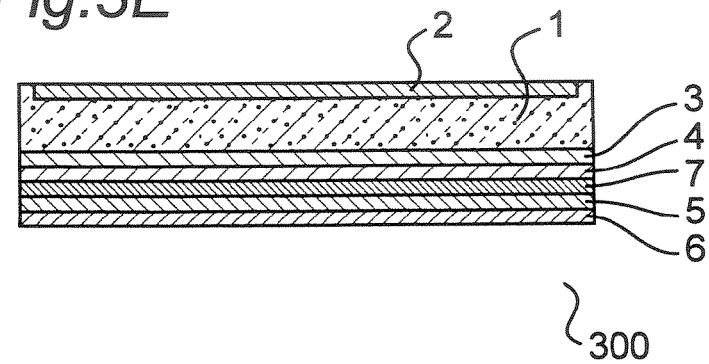

Step 5: As shown in FIG. 2E, the second metal layer 5 of Ni for instance and the third metal layer 6 of Au, Ag or Au—Ag alloy for instance are formed one after another by vapor deposition, sputtering, etc. No thermal processing is executed after forming these metal layers.

In the event that a silicon wafer whose diameter is six inches and film thickness t2 is 60 μm is used as the semiconductor wafer 1, the amount of bending X is 1 mm or less after forming the first metal layer 3 having the film thickness of 200 nm and the barrier metal layer 4 having the film thickness of 100 nm and performing thermal processing.

After forming the second metal layer 5 of 500 nm in thickness and the third metal layer 6 of 200 nm in thickness, the amount of bending X is 2 mm or less.

As the thermal processing step (sintering) is not executed after forming the second metal layer 5 of Ni for instance, it is possible to reduce bending of the semiconductor wafer 1. Where the manufacturing method according to the embodiment 2 is used therefore, it is possible to create an excellent ohmic contact by thermal processing and reduce bending of the semiconductor wafer.

Use of the method according to the embodiment 2 in particular achieves better adhesion between the first metal layer 3 and the barrier metal layer 4.

In the step 5, the temperature of the semiconductor wafer 1 during the formation of the second metal layer 5 and the third metal layer 6 is preferably 80° C. or lower. When the second metal layer 5 and the third metal layer 6 are formed at a low temperature of 80° C. or less, it is possible to further reduce the amount of bending X of the semiconductor wafer 1 down to 1 mm or less.

Embodiment 3

FIGS. 3A through 3E show cross sectional views of steps of manufacturing a semiconductor device according to the embodiment 3, generally denoted at 300. The cross sectional views in FIGS. 3A through 3E show the semiconductor device 300 as it is viewed from the same direction as the IV-IV direction which is shown in FIG. 4. In FIGS. 3A through 3E, the same reference symbols as those used in FIGS. 1A through 1E are the same or corresponding portions. This manufacturing method includes the following steps 1 through 5.

Steps 1 through 4: The steps 1 through 4 shown in FIGS. 3A through 3D are similar to the steps 1 through 4 according to the embodiment 2 described above.

Figure 5A:
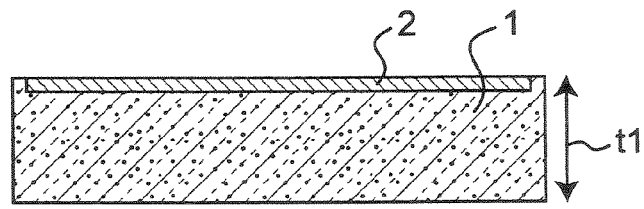
FIGS. 5A through 5D show cross sectional views of conventional steps of manufacturing a semiconductor device.
Figure 5B:
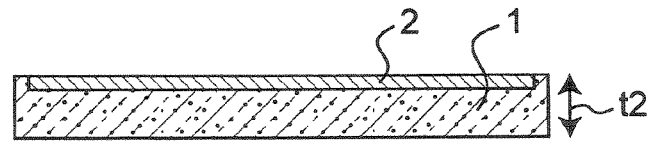
Figure 5C:
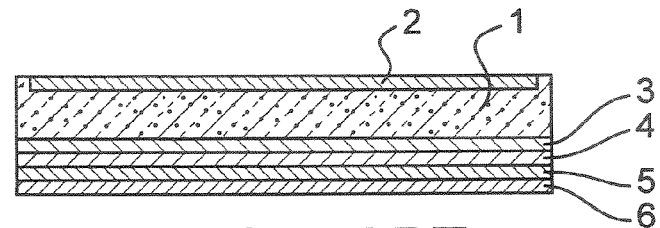
Figure 5D:
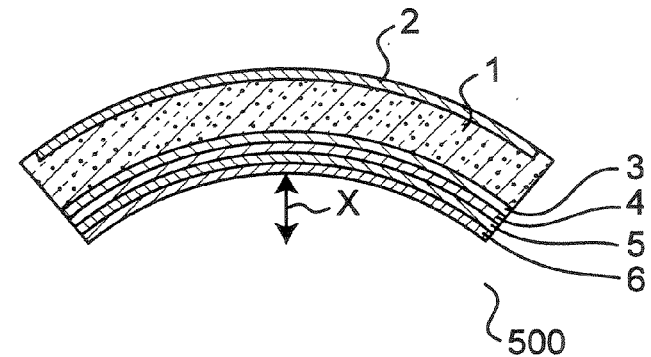
Figure 6:
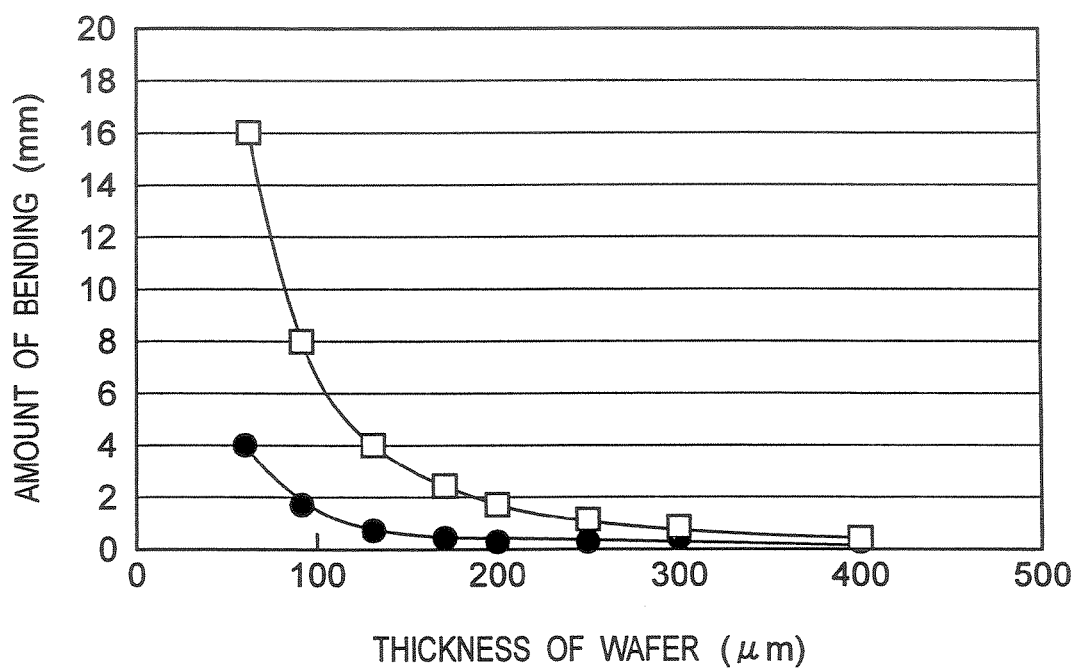
FIG. 6 shows a relationship between the wafer thickness and the amount of bending in a semiconductor device fabricated in accordance with a conventional manufacturing method.

Step 5: As shown in FIG. 5E, a barrier metal layer 7 of Ti, Mo or V, the same material as that of the barrier metal layer 4 is further formed. As the barrier metal layer 7 made of the same material as that of the barrier metal layer 4 is formed after sintering, adhesion between the barrier metal layer 7 and the overlying second metal layer 5 improves.

Following this, the second metal layer 5 of Ni for instance and the third metal layer 6 of Au, Ag or Au—Ag alloy for instance are formed one after another by vapor deposition, sputtering, etc. No thermal processing is executed after forming the barrier metal layer 7 and these metal layers 5 and 6.

In the event that a silicon wafer whose diameter is six inches and film thickness t2 is 60 μm is used as the semiconductor wafer 1, the amount of bending X is 1 mm or less after forming the first metal layer 3 having the film thickness of 200 nm and the barrier metal layer 4 having the film thickness of 100 nm and performing thermal processing.

After forming the barrier metal layer 7, the second metal layer 5 of 500 nm in thickness and the third metal layer 6 of 200 nm in thickness, the amount of bending X is 2 mm or less.

As the thermal processing step (sintering) is not executed after forming the second metal layer 5 of Ni for instance, it is possible to reduce bending of the semiconductor wafer 1. Where the manufacturing method according to the embodiment 3 is used therefore, it is possible to create an excellent ohmic contact by thermal processing and reduce bending of the semiconductor wafer.

In the step 5, the temperature of the semiconductor wafer 1 during the formation of the barrier metal layer 7, the second metal layer 5 and the third metal layer 6 is preferably 80° C. or lower. When the barrier metal layer 7, the second metal layer 5 and the third metal layer 6 are formed at a low temperature of 80° C. or less, it is possible to further reduce the amount of bending X of the semiconductor wafer 1 down to 1 mm or less.

What is claimed is:

1. A method of manufacturing a power semiconductor device having a back surface electrode, comprising:
    forming an insulated gate bipolar transistor on a semiconductor wafer having a front surface and a back surface;
    polishing the back surface of the semiconductor wafer;
    forming a first metal layer on said back surface of said semiconductor wafer after polishing;
    executing thermal processing to create an ohmic contact between said semiconductor wafer and said first metal layer at a temperature between of 300° C. and 470° C;
    forming a second metal layer of Ni on said first metal layer, the second metal layer being formed without further thermal processing; and
    reducing warping in the semiconductor wafer by maintaining a temperature of the semiconductor wafer at or below 80° C. during forming of the second metal layer.

2. The manufacturing method according to claim 1, wherein a barrier metal layer is formed after said thermal processing is performed, and said second metal layer is formed on said barrier metal layer.

3. The manufacturing method according to claim 1, wherein a barrier metal layer is formed on said first metal layer prior to said thermal processing, and after said thermal processing, said second metal layer is formed on said barrier metal layer.

4. The manufacturing method according to claim 1, wherein a barrier metal layer is formed on said first metal layer prior to said thermal processing, and after said thermal processing, a second barrier metal layer is formed on said barrier metal layer and said second metal layer is formed on said second barrier metal layer.

5. The manufacturing method according to claim 1, wherein said first metal layer is made of a material which is selected from the group consisting of Al and Al—Si alloy.

6. The manufacturing method according to claim 1, wherein ions are implanted in the back surface of the semiconductor wafer prior to forming the first metal layer.

7. The manufacturing method according to claim 1, further comprising:
    forming a third metal layer on the second metal layer without further thermal processing, the third metal layer including at least one of Au, Ag and Au—Ag.

8. The manufacturing method according to claim 6, wherein the ions include As.

9. The manufacturing method according to claim 6 wherein the ions include boron.

10. The manufacturing method according to claim 2, wherein the barrier layer is formed of molybdenum.

11. The manufacturing method according to claim 2, wherein the barrier layer is formed from of vanadium.

12. The manufacturing method according to claim 1, wherein the first metal is formed using vapor deposition.

* * * * *